United States Patent [19]

Takemae

[11] Patent Number: 4,758,993
[45] Date of Patent: Jul. 19, 1988

[54] RANDOM ACCESS MEMORY DEVICE FORMED ON A SEMICONDUCTOR SUBSTRATE HAVING AN ARRAY OF MEMORY CELLS DIVIDED INTO SUB-ARRAYS

[75] Inventor: Yoshihiro Takemae, Tokyo, Japan

[73] Assignee: Fujitsu Limited, Kanagawa, Japan

[21] Appl. No.: 798,785

[22] Filed: Nov. 18, 1985

[30] Foreign Application Priority Data

Nov. 19, 1984 [JP] Japan ................................. 59-243965
Nov. 20, 1984 [JP] Japan ................................. 59-245800
Nov. 21, 1984 [JP] Japan ................................. 59-246814

[51] Int. Cl.$^4$ ............................................... G11C 8/00
[52] U.S. Cl. ........................................ 365/222; 365/230
[58] Field of Search ..................... 365/189, 222, 230

[56] References Cited

U.S. PATENT DOCUMENTS 3,810,129 5/1974 Behman et al. ..................... 365/222
4,106,108 8/1978 Cislaghi ............................... 365/222
4,112,513 9/1978 Elsner .................................. 365/222

*Primary Examiner*—James W. Moffitt
*Attorney, Agent, or Firm*—Armstrong, Nikaido, Marmelstein & Kubovcik

[57] ABSTRACT

A dynamic random access memory (DRAM) device is formed on a semiconductor substrate, the device having an array of memory cells which are divided in several sub-arrays. The device has memory blocks each containing one of the sub-arrays, a word decoder and column decoder. Each of the memory blocks is selected independently to perform an access operation and refresh operation. As long as different memory blocks are selected for the respective operations, both operations are performed in parallel, however, when the same memory block is selected for both operations, namely, double selection, a comparison circuit detects the double selection and gives priority to one of the operations. The operation selected thus, preferentially performed. Usually, the refresh operations is then performed. However, in order to decrease the "busy ratio" of the device, the access operation is performed preferentially. Further, a complicated operation for priority selection may be performed according to a predetermined schedule memorized in a priority providing means. In addition, a common word bus line is proposed for accessing each of the memory blocks, namely, each sub-arrays, in order to reduce the number of common word lines for realizing a further high packing denisty of the DRAM device. This common bus line is also applicable to other devices such as a static RAM.

13 Claims, 11 Drawing Sheets

RANDOM ACCESS MEMORY DEVICE FORMED ON A SEMICONDUCTOR SUBSTRATE HAVING AN ARRAY OF MEMORY CELLS DIVIDED INTO SUB-ARRAYS

BACKGROUND OF THE INVENTION

The present invention relates to a random access memory (RAM) device having a high memory density formed on a semiconductor substrate. Particularly, it relates to a dynamic RAM (DRAM) device having an array of memory cells which are divided into several sub-arrays of the memory cells. The present invention further relates to a control system for selecting the sub-arrays of memory cells for a refresh operation and an access operation thereto, and overcoming the problem of double selection of the same sub-array in order to reduce the "busy ratio". The present invention also relates to a bus line commonly used for several sub-arrays in order to reduce the number of word decoders.

The organization of a prior art dynamic random access memory (DRAM) of 4M bits, for example, is schematically shown in FIG. 1. The DRAM has approximately 4.2 M memory cells MC arranged in a relatively long rectangular matrix of 512×8192 cells. The memory cells disposed in the matrix are connected to one of 8192 bit lines BL0 to BL8191 and one of 512 word lines WL0 to WL511. The DRAM is designed to have fairly short bit lines to reduce parasitic capacitance of the associated bit line in order to achieve fairly high speed operation and differential output signals of high voltage. Accessing to a memory cell MC is performed through a word line WL and a bit line BL which are selected respectively by a word decoder WD and a column decoder CD. An output signal of a memory cell MC is amplified by a sense amplifier SA (SA0 to SA8191) connected to the associated bit line and outputed to an external circuit. Although a DRAM has the advantage of small power consumption in comparison with other RAMs, such as a static RAM, still the power consumption of the DRAM of an extraordinary high capacity such as 4M bits is a serious problem to be solved. Assuming that each bit line BL of the DRAM of FIG. 1 has capacitance of 0.5 pF, the power source voltage Vcc is 5 V, and the operation cycle time is 200 nS, the power consumption of the DRAM becomes approximately 0.5W and the average current is 100mA. This power consumption adversely affects the junction temperature of the associated semiconductor devices such as metal oxide semiconductor field effect transistors (MOS FETs).

In a DRAM, a refresh operation is indispensable. Because the memory of data in a memory cell is achieved by the charge stored in the capacitance of the cells, it may be lost gradually by junction leakage of the MOS FETs. Thus the stored data is required to be refreshed within an adequate time. Accordingly, the stored data is periodically read from the memory cells and rewritten thereinto. During the refresh operation, all memory cells belonging to one row of the matrix array are refreshed simultaneously, making all the bit lines and relevant sense amplifiers busy. Therefore, the refresh operation and the access operation cannot be carried out at the same time.

The refresh operation is performed sequentially with all rows, namely all word lines, of the DRAM and the refresh cycle time for every memory cell is predetermined, such as 8 mS at present. Therefore, with a memory cell of FIG. 1, the refresh operation is performed sequentially with a time interval of approximately 16 μS (8 mS/512=15.6 μS) for each word line. The time necessary for completing one refresh operation is 200 nS.

In an ordinary DRAM, as described above, the access operation and refresh operation can not be performed simultaneously. In order to avoid the above double operation, a refresh controller is attached to the memory device, putting priority to the refresh operation and making the access operation wait during the refresh operation. Since a read/write operation time is also 200 nS, the ratio of the waiting time of read/write operation to the cycle time is 1.25% (200 nS/16 μS). Hereinafter, this ratio is referred to as a "busy ratio". When the size of a storage device is not so large, the busy ratio is naturally small and has not been a serious problem. However, as the size of a DRAM is enlarged and the number of word lines are increased, the busy ratio will increase, becoming one of the problems peculiar to large scale DRAMs.

Generally, an array of a DRAM having a great number of memory cells is divided into several subsections of memory cells, such as two, four or eight subsections as described in the report by John G. Posa, on page 122, *Electronics*, May 22, 1980. Particularly, the partitioned array subsections, hereinafter referred to as "sub-arrays", may be used as partial devices, and it is possible to shut down unused sub-arrays to conserve active power. The DRAM device handled in the present invention also has such a configuration of memory cells, namely an array of sub-arrays, aiming at saving of power consumption. The partition of a memory cell array is also advantageous to achieve a high speed operation due to shortened word lines and bit lines. On the other hand, additional peripheral circuits become necessary such as word decoders for each sub-array must not be selected for a refresh operation and an access operation at the same time for the same reason described above.

SUMMARY OF THE INVENTION

The object of the presen invention is to reduce operating power consumption of a large capacity DRAM device formed on a semiconductor substrate.

Another object of the present invention is to provide a DRAM having sub-arrays of memory cells with a control system therefor in order to reduce its busy ratio.

Still another object of the present invention is to provide a RAM device formed on a semiconductor substrate having several sub-arrays of memory cells with a control bus line which can reduce the total number of word decoders for the sub-arrays.

A dynamic random access memory (DRAM) device according to the present invention has an array of memory cells arranged in a matrix and separated into several subsections, or sub-arrays, the number of which is usually selected as two, four, eight, etc. A word decoder and a column decoder are connected to each sub-array, forming a memory block (hereinafter simply a "block"). The DRAM device has an access peripheral circuit outputting signals for selecting a specified block and signals for accessing a memory cell therein, and a refresh peripheral circuit outputting signals for selecting a block and signals for sequentially refreshing all the memory cells in a predetermined order. The feature of the present invention is that the access peripheral circuit and the refresh peripheral circuit can operate independently unlike the prior art DRAMs. As a result, a refresh operation and an access operation can be performed simultaneously for different sub-arrays or blocks. However, when both operations are to be performed with the same block, priority must be determined be given to the refresh operation or to the access operation such that the busy ratio of the total device is minimized. For this purpose, a block selection control circuit is disposed in the DRAM device for processing the above-mentioned block selection signals. The circuit contains a comparison circuit for detecting a simultaneous occurrence of the selection of an access operation and a refresh operation at the same block.

In addition, in order to reduce the total number of word decoders which are disposed individually in each block, an improved bus line is proposed enabling the use of one common word decoder for every block. Furthermore, there is proposed another modified bus line, through which two or more word lines of the associated memory block can be selected. As the result, the number of common word lines in the bus line can be reduced to half or less. These bus lines are applicable not only to a DRAM but also to other semiconductor devices having sub-arrays such as static RAMs.

Details of these features and advantages of the present invention will become clear from a reading of the detailed description and claims of the invention with reference to the accompanying drawings, wherein like numerals refer to like parts.

DESCRIPTION OF THE PREFERRED EMBODIMENT

Figure 1:
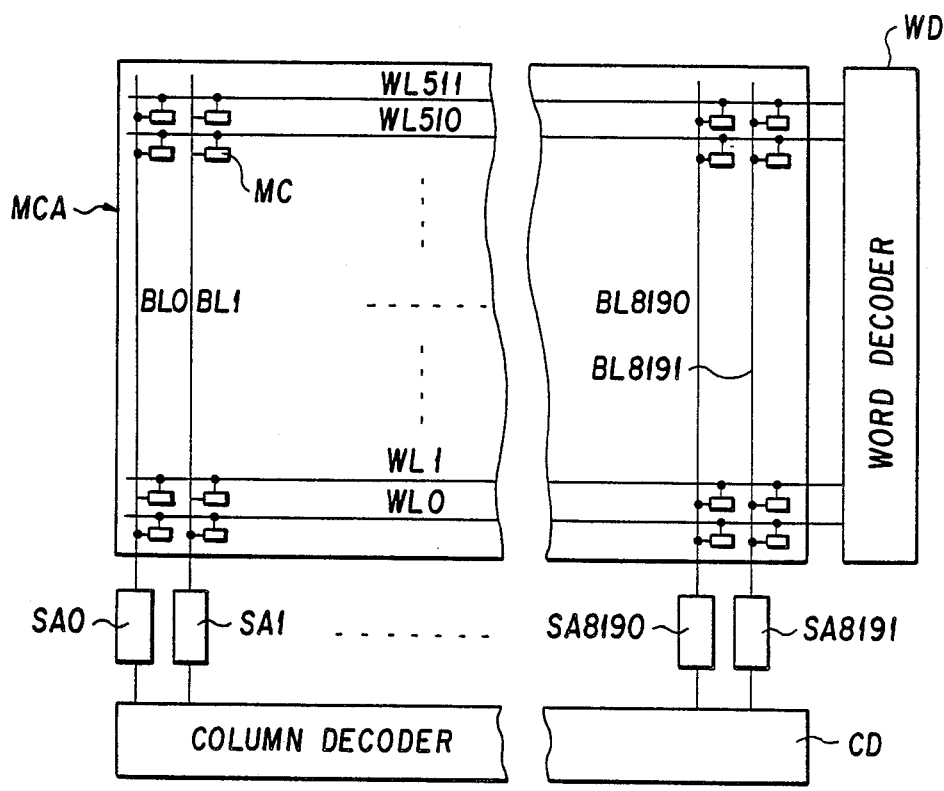
FIG. 1 is a schematic diagram of a prior art DRAM device, illustrating the configuration of memory cell array and relevant peripheral circuits.
Figure 2A:
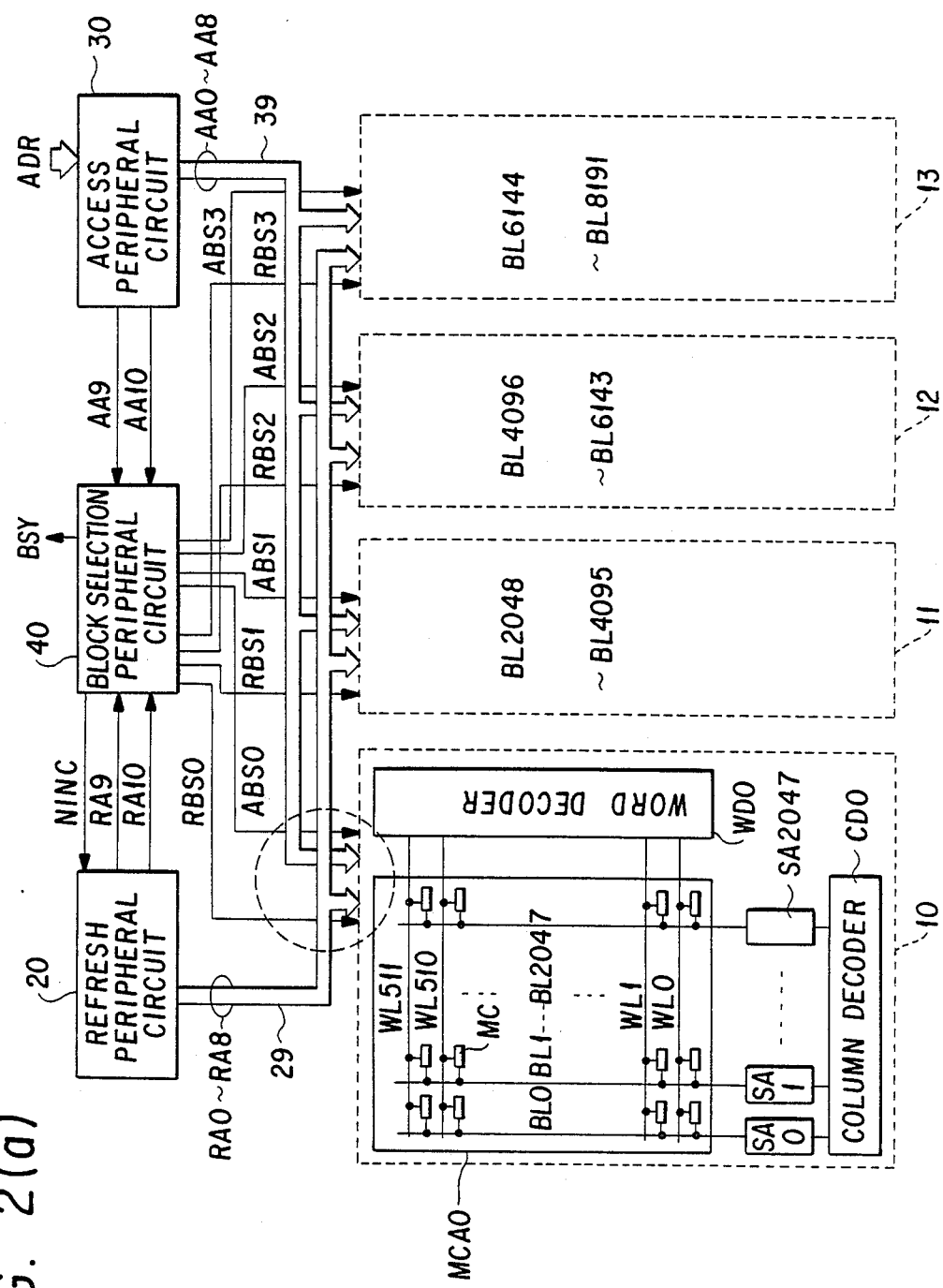
FIG. 2(a) is a block diagram of the first embodiment of the present invention, illustrating the total configuration of a DRAM device formed on a semiconductor substrate.

A circuit configuration of the present invention is shown in a block diagram of FIG. 2(a), which comprises memory blocks 10 to 13, a refresh peripheral circuit 20, an access peripheral circuit 30 and block selection peripheral circuit 40. The array of memory cells $512 \times 8192$ (approximately 4.2M cells) is divided into four blocks 10, 11, 12, and 13, each having a sub-array, MCA0 to MCA3, of $512 \times 2048$ memory cells; a word decoder, WD0 to WD3; and a column decoder, CD0 to CD3 (in the figure, only MCA0, WD0, and CD0 are shown). The total array has the same long rectangular shape as that of the prior art array of FIG. 1. In the block 10, for example, the sub-array MCA0 has 512 word lines WD0 to WD511 and 2048 bit lines BL0 to BL2047. Sense amplifiers SA0 to SA2047 are disposed at the end of corresponding bit lines. Other blocks also have similar circuits to those of the block 10. Using a block selection peripheral circuit 40, one of the blocks is selected for a refresh or an access operation. The DRAM device also has a refresh peripheral circuit 20 and an access peripheral circuit 30. These circuits 20, 30, and 40 are commonly used for each block, 10, 11, 12, or 13 through bus lines.

The access peripheral circuit 30, receiving outer address signals ADR supplied from a central processing unit (CPU) of a computer, outputs access address signals of two bits of upper rank, AA9 and AA10, to the block selection peripheral circuit 40, and access address signals of 9 bits of lower rank, AA0 to AA8, to the word decoder WD0 to WD3 of each sub-array respectively through an acces bus line 39.

Figure 3:
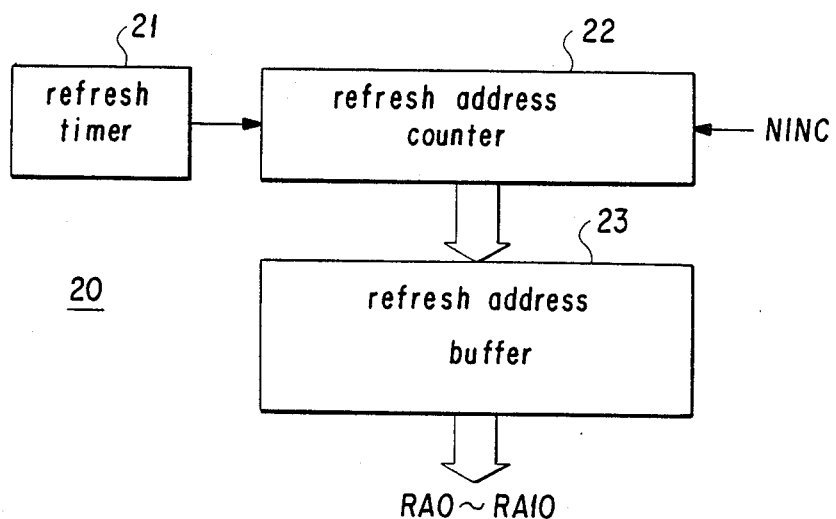
FIG. 3 is a block diagram of one embodiment of the refresh peripheral circuit of the DRAM device shown in FIG. 2(a).
Figure 4:
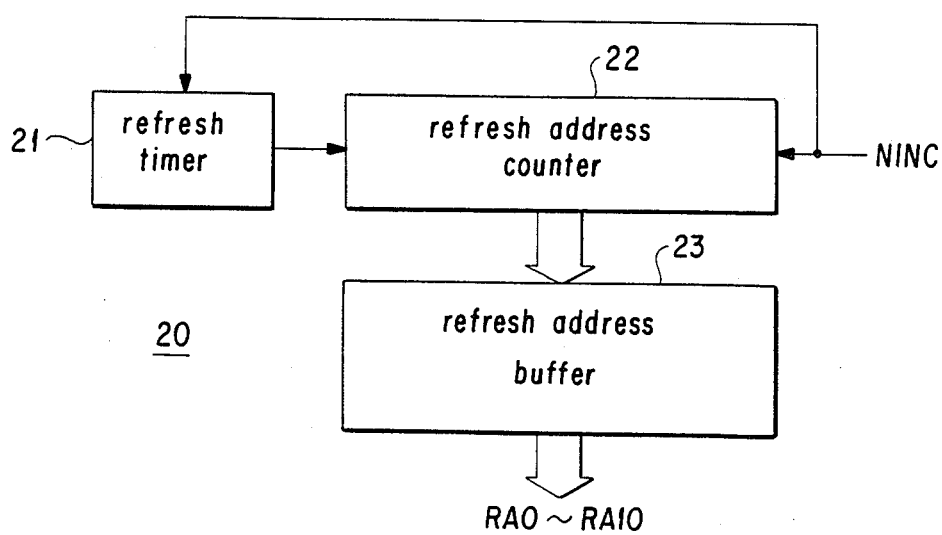
FIG. 4 is a block diagram of an alternate embodiment of the refresh peripheral circuit of the DRAM device shown in FIG. 2(a).

The refresh peripheral circuit 20 has refresh timer 21 therein for generating refresh clock signals as shown in a block diagram of FIG. 3 and FIG. 4. The refresh cycle time is 4 $\mu$S which is a quarter of that of 16 $\mu$S of the prior art DRAM described above. This is because the refresh operation is performed sequentially to all memory cells of the DRAM device. The total refresh operation of the device is completed with a cycle, starting from the word line WL0 of the sub-array MCA0, for example, and ending at the word line WL511 of the sub-array MCA0. The refresh operation then moves to the next sub-array MCA1, and finally ends at the word line WL511 of the sub-array MCA3. Since each memory cell should be refreshed within 8 mS in order to maintain its stored memory data, the total refresh operation cycle time must be shorter than 8 mS.

The clock signals are counted by a refresh address counter 22, generating and sending refresh address signals of 11 bits, RA0 to RA10, to a refresh address buffer 23. Two bits of upper rank RA9 and RA10 are used for selecting the blocks 10 to 13, and nine bits of lower rank, RA0 and RA8 are sent to each word decoder WD0 to WD3 through a refresh bus line 29 and used for selecting the word lines WL0 to WL511 of each of the sub-arrays MCA0 to MCA3. Of course, in the access operation, column selection address signals are generated and supplied to the column lines of each sub-array, the description of which is omitted for simplicity.

Figure 2B:
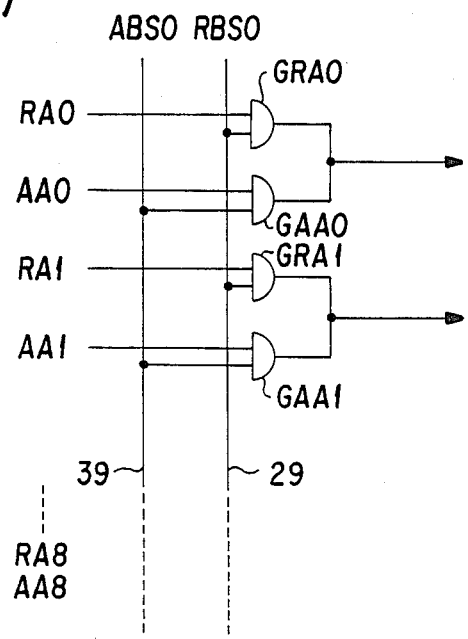
FIG. 2(b) is a schematic wiring diagram of an interface circuit contained in the dotted circle of FIG. 2(a).

FIG. 2(b) is a connection diagram, illustrating the interface circuit designated by the dotted circle in FIG. 2(a). The function of the circuit is apparent. For example, when the block 10 is refreshed, a refresh block selection signal RBS0 (described later) from the circuit 40 and a refresh address signal RA0 from the circuit 20 are sent to a gate GRA0 making the gate conductive. Thus the signal RA0 is sent to the word decoder WD0. Other signals RA1 to RA8 are also sent to the word decoder WD0 in the similar manner, selecting a word line of the sub-array MCA0. For access operation, the transmitting of relevant signals from the access peripheral circuit 30 is performed in the similar manner.

Figure 5B:
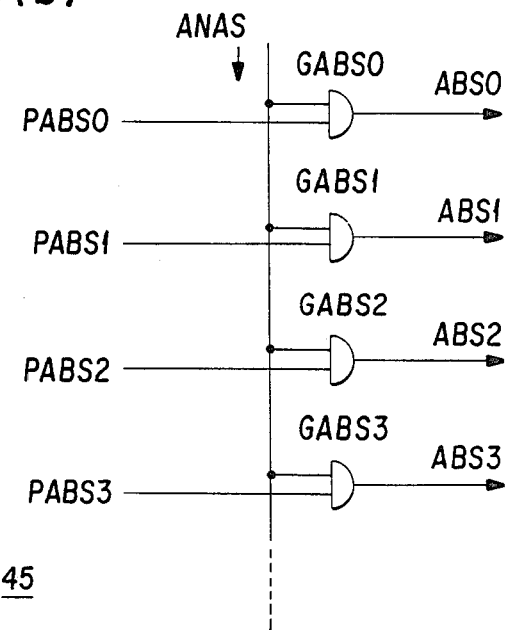
FIG. 5(b) is a wiring diagram of the access block selection invalid circuit shown in FIG. 5(a).
Figure 5A:
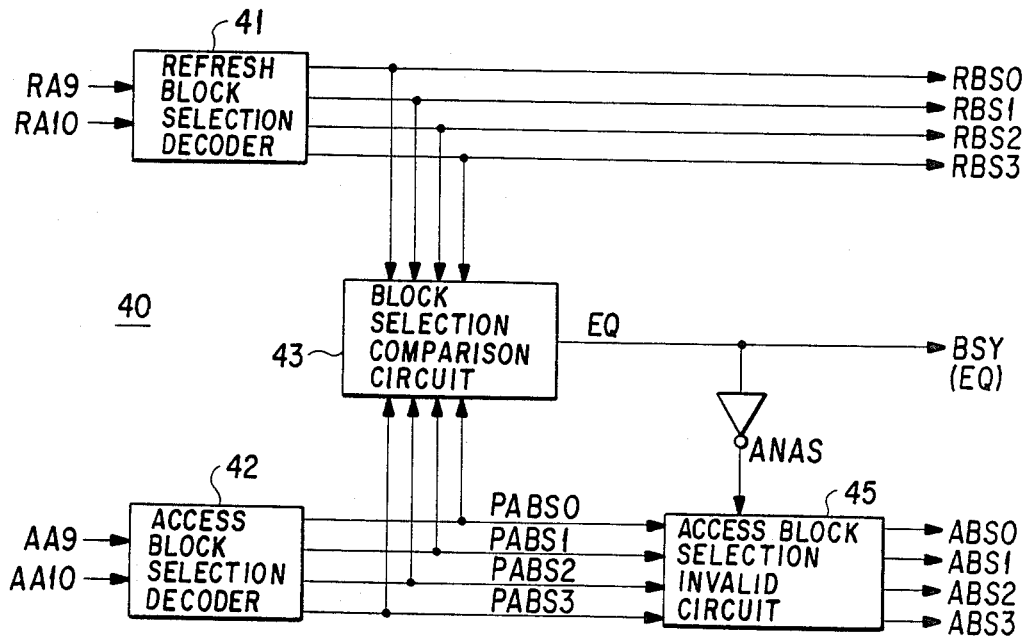
FIG. 5(a) is a block diagram of one embodiment the block selection peripheral circuit of FIG. 2(a).
Figure 6:
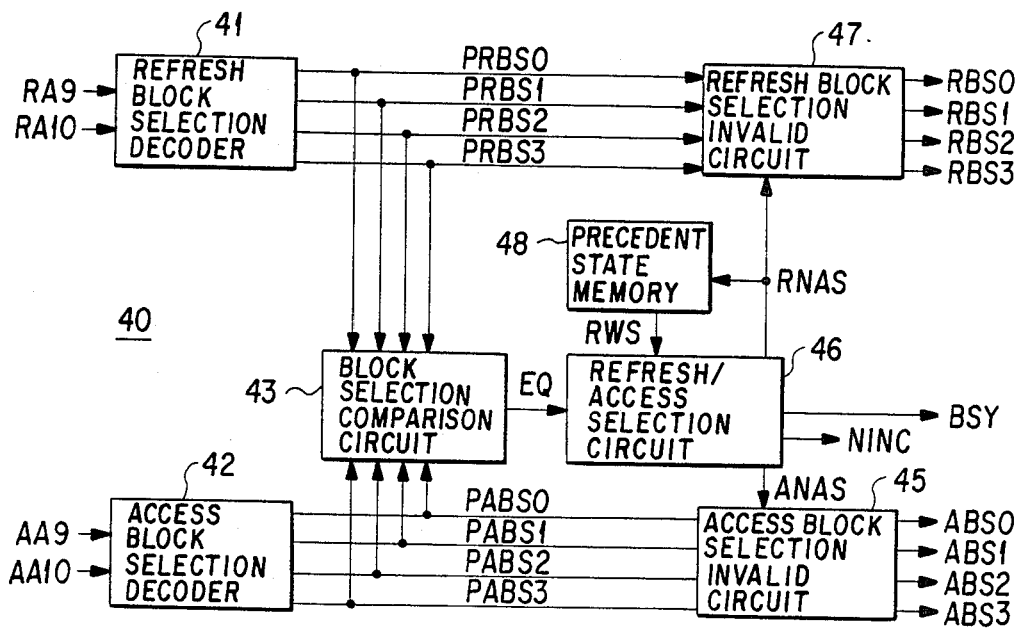
FIG. 6 is of a block diagram of an alternate embodiment of the block selection peripheral circuit shown in FIG. 2(a).

The block selection peripheral circuit 40, as shown in the block diagram of FIG. 5(a) or FIG. 6, comprises a refresh block selection decoder 41 for decoding the refresh address signals RA9 and RA10 and outputting refresh block selection signals RBS0 to RBS3 to select the block to be refreshed; and an access block selection decoder 42 for decoding access block selection signals AA9 and AA10, and outputting access block pre-selection signals PABS0 to PABS3 for preliminary selection of the block to be accessed. The block selection peripheral circuit 40 further includes a block selection signal comparison circuit 43 and access block selection signal invalid circuit 45 as shown in FIG. 5(a).

As mentioned above, the refresh block selection operation is performed sequentially while the access block selection operation is performed according to the requirement for reading or writing which is random. As the result, access operation and refresh operation may happen to occur simultaneously in the same block. This doubled selection of a block is detected by the block selection signal comparison circuit 43. Since the selection of the memory blocks 10 and 13 are effected by the output signals RBS0 to RBS3 from the decoder 41 for the refresh operation and the output signals PABS0 to PABS3 from the decoder 42 for the access operation, the double selection of a block is detected by comparing above output signals of the two groups to each other. For example, when the signal RBS0 and the signal PABS0 are selected simultaneously, that is, the block 10 is double selected, access block selection signals are held, and a busy signal BSY is output to a terminal connected to an outside circuit such as a CPU.

FIG. 6 is a block diagram of a modified block selection peripheral circuit 40, additionally having a priority providing means comprising a precedent state memory 48 and a refresh/access selection circuit 46. When the refresh signals are to be held, a refresh address increment invalid signal NINC is output to the refresh peripheral circuit 20 as described later.

In the embodiment shown in FIG. 5(a), the refresh operation maintains priority over the access operation. Block diagrams of the refresh peripheral circuit 20 and the block selection peripheral circuit 40 are illustrated respectively in FIG. 3 and FIG. 5(a). As shown in FIG. 5(a), when a double selection signal EQ, indicating that the relevant block is double selected, is output, the signal EQ is inverted and converted to an access invalid signal ANAS, and input to an access block selection invalid circuit 45. At the same time, the double selection signal EQ is also output as a busy signal BSY to the relevant outside circuit such as a CPU of a computer, for instance, to stop further access operation.

The access block selection invalid circuit 45 is composed as shown in FIG. 5(b). The circuit 45 comprises four AND gates, GABS0 to GABS3. One of the pre-access block selection signals and the signal ANAS are applied to each gate. When the signal ANAS is H (logic 1), indicating no double selection, the signals PABS0 to PABS3 can pass through the gates and are output unchanged as the signals ABS0 to ABS3 respectively. When the signal ANAS is L (logic 0), indicating the occurrence of a double selection, the gates are not opened, thus outputting L signals. In other words, all the pre-access block selection signals PABS0 to PABS3 are converted into logic 0, even though the signals are logic 1. As the result, one of four blocks is selected by the refresh block selection signals RBS0 to RBS3, whereby one of them, is logic 1 and the others are logic 0.

As described above, one refresh operation is performed in every 4 μS and each refresh operation takes 200 nS. Usually both operations are performed in parallel. The probability of selecting one block for a refresh operation and an access operation at the same time becomes then 200 nS/4 μS/4=1.25%, which is the same value as that of the prior art DRAM device of FIG. 1. In other words, the busy ratio remains unchanged. However, it becomes possible to enable only one of sub-arrays at a time to reduce power consumption down to approximately a quarter. This is ascribed to the refresh peripheral circuit 20 and access peripheral circuit 30, both of which operate independently of each other and are controlled by the block selection peripheral circuit 40 to overcome the double selection of a block.

The alternate embodiment shown in FIG. 6 further improves the busy ratio. In this embodiment, one of the refresh operation and access operation is preferentially conducted according to a predetermined priority such that the busy ratio of the device is minimized. The alternative embodiment may be referred to as an access priority type circuit, while the first embodiment is a refresh priority type. An access operation has a priority over a simultaneously occurring refresh operation, and if the double selection of a block happens less than a predetermined number of times, N, further access operations are performed preferentially.

The block diagram of the alternate embodiment is the same as that of the first embodiment shown in FIG. 5(a). However, in the alternate embodiment, when a double selection occurs at one of the blocks, a refresh increment invalid signal NINC is sent from the block selection peripheral circuit 40 to the refresh address counter 22 as shown in FIG. 3.

FIG. 6 shows a block diagram of the block selection peripheral circuit 40 of FIG. 2(a). For simplicity, a case of N=1 will be described in the following. In this embodiment, pre-refresh block selection signals PRBS0 to PRBS3 from a refresh block selection decoder 42 are controlled by a refresh block selection circuit 47. On receiving a double selection signal EQ from the block selection comparison circuit 43 for the first time, a refresh/access selection circuit 46 outputs a refresh invalid signal RNAS of logic 1 to invalidate all signals RBS0 to RBS3 from the circuit 47, converting the signals into logic 0. Thus, the access invalid signal ANAS is held at logic 0, allowing the output signals of the decoder 42 to pass the circuit 45. This preferential access state of the relevant block is stored in a preceding state memory circuit 48.

Simultaneously, a refresh address increment signal NINC from the block selection peripheral circuit 40 is sent to the counter 22 to make the counter 22 (FIG. 3) temporarily stop its increment operation for N times (here N is taken as 1). Accordingly, the following refresh address signals RA0 to RA3 remain as the same as the stopped ones. When the next refresh cycle comes and another double selection signal EQ is input, the probability of which is ¼, the signal RNAS is converted to logic 0 to provide the next refresh operation with priority, because the refresh waiting signal RWS from the preceding state memory circuit 48 is at logic 1. Thereafter, the memory circuit 48 is reset and the signal ANAS is made logic 0 in preparation for further operation.

Figure 7:
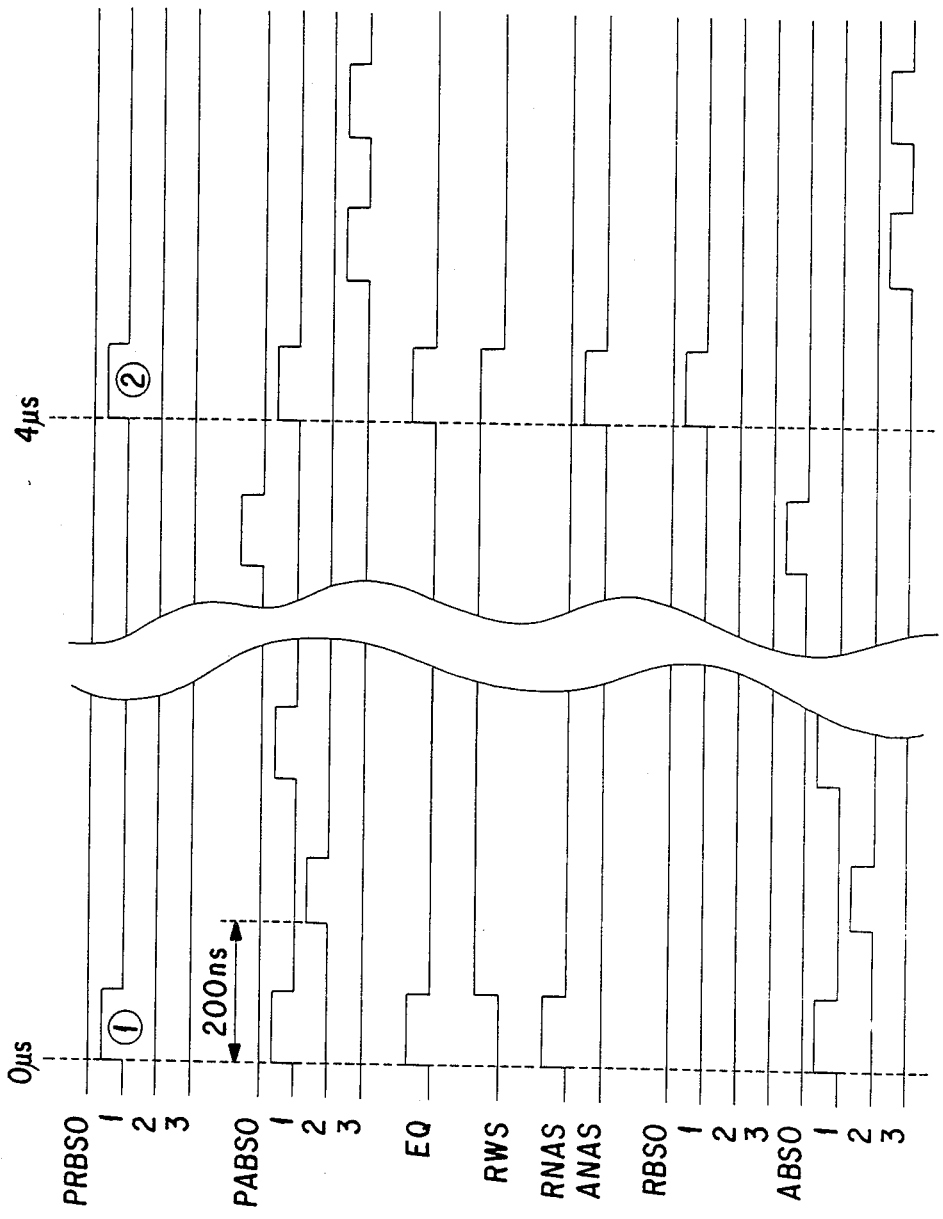
FIG. 7 is a time chart illustrating a consecutive occurrence of two double selections for refresh and access operations.

FIG. 7 is a time chart of the associated various signals illustrating the situation wherein two consecutive double selection operations occur in the block 11 which is selected by the signals PRBS1 and PABS1. At the first double selection signified by (1) in the chart, the signal RNAS≠ is logic 1 and the signal ANAS is logic 0, allowing the access operation to be performed preferentially, and at the second double selection signified by (2), the signal ANAS is logic 1 and RNAS is logic 0, allowing preference to the refresh signals which are held at the preceding time. Namely, signal RBS1 is at logic 1 and ABS1 is at logic 0.

Figure 8:
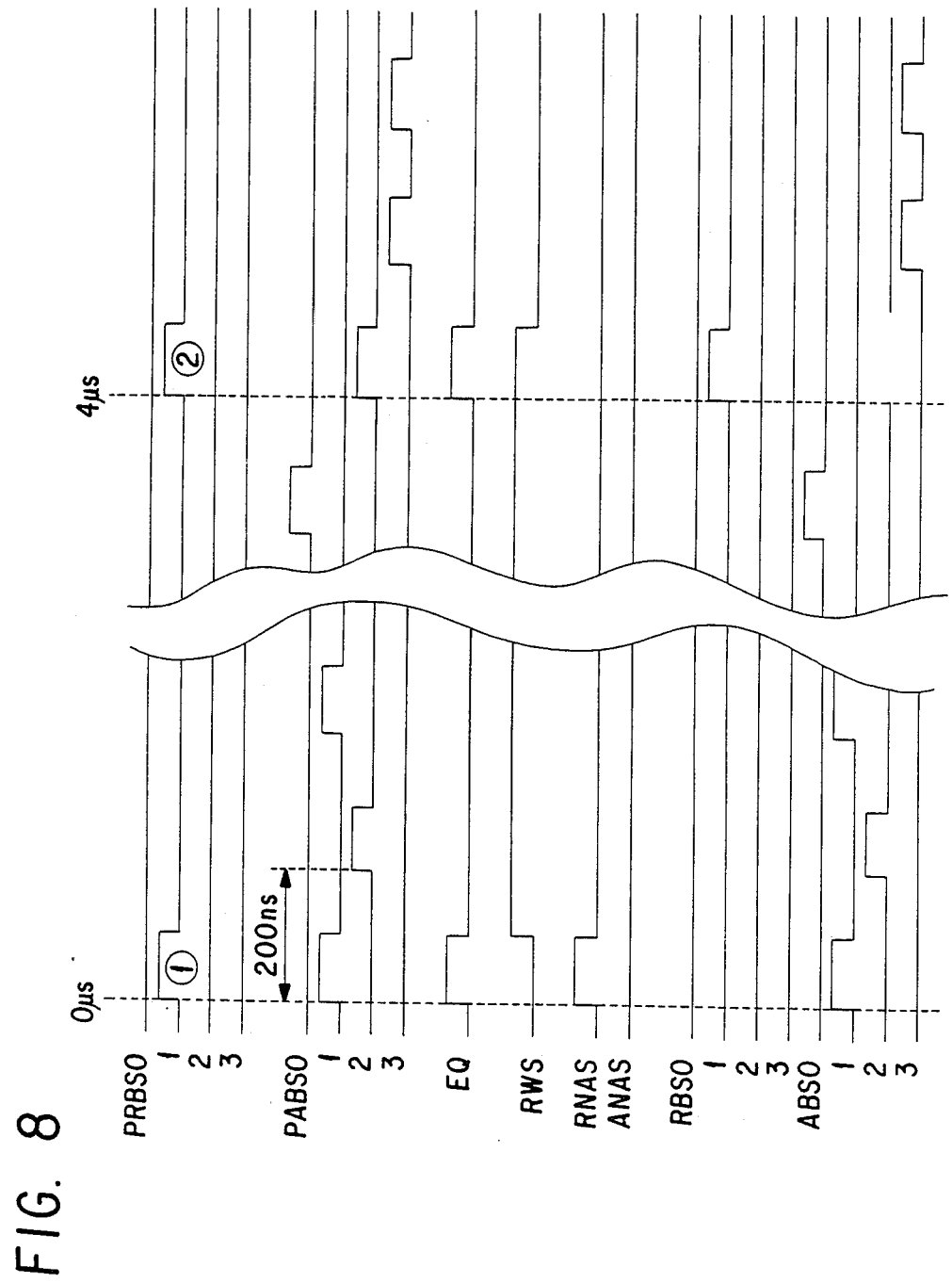
FIG. 8 is a time chart illustrating an occurrence of only one double selection for refresh and access operations.

FIG. 8 is also a time chart illustrating a situation wherein the second time double selection of block 11 has not occurred, namely the signals PRBS1 and PRBS2 occurred simultaneously at different blocks 11 and 12 respectively. In this situation, the refresh operation held at the preceding time interval is executed to recover the preceding signal. Assuming that the access operation to a block is random, the probability of selecting a specified block, hereby the block 11, becomes ¼. Thus, the busy ratio of the total device is reduced to 0.31%, which is ¼ of the busy ratio, 1.25%. Therefore, the waiting times for the refresh operation N is larger, two times for instance, and the busy ratio can be expected to be reduced remarkably. On the other hand, the refresh time of some of memory cells is prolonged and exceeds the time limit for securing the memory data stored therein in the worst case. Although this probability is extremely low and may not become a problem in practical use, another embodiment is proposed to overcome the above defect.

The block diagram of the embodiment is shown in FIG. 2(a) and those of the block selection peripheral circuit 40 and the refresh peripheral circuit 20 are shown respectively in FIG. 6 and FIG. 4. The refresh timer 21 of FIG. 4 sends out clock pulses periodically with a time cycle of 4 μS. On receiving a refresh address increment invalid signal NINC, the next refresh clock signal is sent from the refresh timer 21 to the refresh address counter 22 after an interval of 200 nS, not the refresh cycle time of 4 μS.

Figure 9:
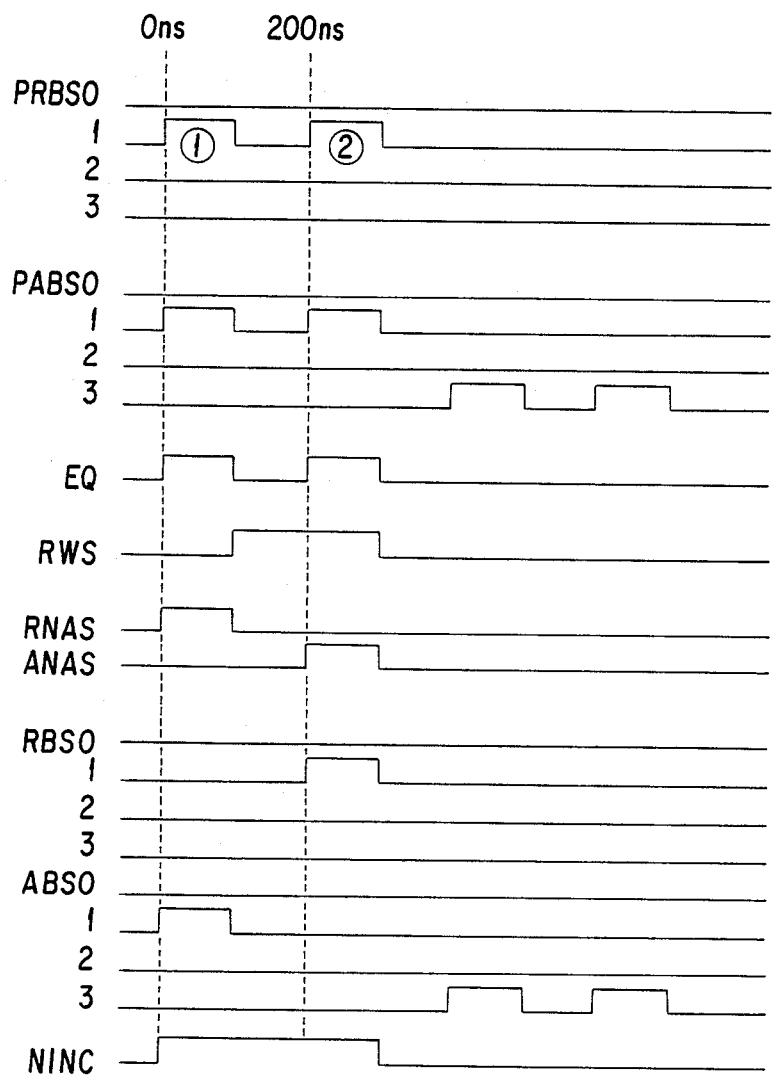
FIG. 9 is a time chart illustrating a quick output of the second time double selection signal after the occurrence of the first time double selection for refresh and access operations.

Consequently, as shown in the time chart of FIG. 9, after the first time double selection (1), a pre-refresh block selection signal PRBS1, the second time double selection signal, is output with a time interval of 200 nS, not waiting for 4 μS, is the same block 11. The actual prolonged time in only 200 nS, which is a small time length which is negligible in comparison with the refresh cycle time of 4 μS. By this system, consecutive double selections of a block of more than two times can be overcome by providing them with priority successively in a similar manner to that described above.

Hereinafter, a further improvement of the DRAM device for higher packing density will be described.

In the above embodiments, as shown in FIG. 2(a), each block has its own word decoder which occupies a considerable area on the semiconductor substrate of the DRAM device. This is undesirable for higher packing density of the device. The number of word decoders must be reduced by the common usage thereof. In the following fourth embodiment, a pair of word bus lines is proposed to realize the reduction of the relevant word decoders and still to enable a refresh operation and an access operation at different blocks simultaneously.

Figure 10:
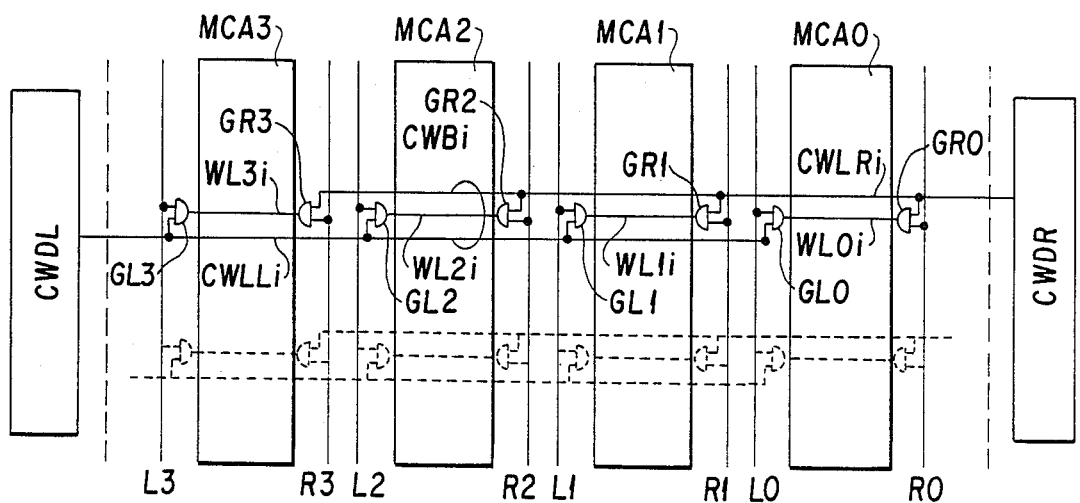
FIG. 10 is a block diagram, illustrating a first alternate embodiment the circuit block configuration shown in FIG. 2(a).

FIG. 10 is a block diagram of a first alternative embodiment of the word decoders and word lines, illustrating only the mutual relation between memory cell sub-arrays MCA0 to MCA3, two common word decoders CWDR and CWDL, and a word bus line connecting the elements. With this configuration, only two word decoders are sufficient to drive four sub-arrays, performing mutually independent refresh operations and access operations simultaneously in a manner similar to that described above.

Only a pair of i-th word lines WL0i to WL3i contained respectively in the arrays MCA0 to MCA3 are shown with one in solid lines and the other in dotted lines. The other word lines are not shown in the figure. The word decoders are not attached to every sub-array or block, but two common word decoders CWDR and CWDL are disposed on the chip of the DRAM device. A common word bus line CWBi comprises two common word lines CWLRi and CWLLi connected respectively to the common word decoders CWDR and CWDL. Each word line WL0i and WL3i of each sub-array MCA0 to MCA3 has two word selection gates (AND gates) GR0, GL0, to GR3, GL3 at each end for selecting the common word decoders CWDR and CWDL. These word bus lines and common word lines run in parallel on the chip. While block selection lines L0 to L3 for the common decoder CWDL, and another block selection lines R0 to R3, for the word decoder CWDR run in parallel with bit lines (not shown in FIG. 10 but shown in FIG. 2(a)). The block selection lines are connected to respective word lines through the AND gates GR0, GL0, etc. Thus, for instance, output signals from the common word decoder CWDR and block selection line R0 are applied to the block selection gate GR0. Output signals from the common word decoder CWDL and the block selection line L0 are applied to the block selection gate GL0. Signals are input to the other gates in a similar manner. As a result, any word line of any block can be selected or accessed by the associated signals from the common word decoder CWDR and CWDL and one of the block selection lines. The block selection signals (not shown) are supplied from the block selection peripheral circuit 40 of FIG. 2(a), and the word decoder selection signals (not shown) are supplied from a word decoder selection circuit (not shown).

Figure 11:
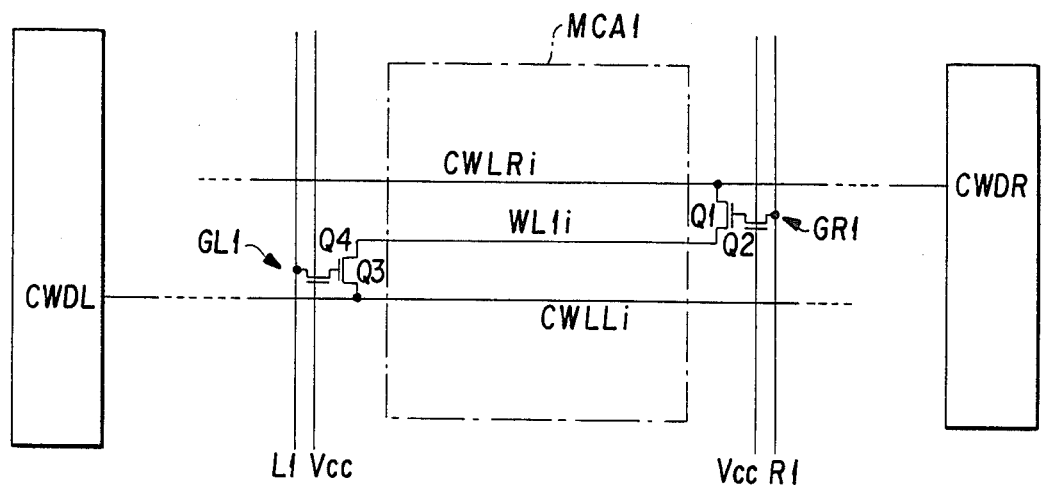
FIG. 11 is a partial schematic wiring diagram of a word bus line and a sub-array of memory cells.

FIG. 11 is a partial schematic wiring diagram of one of the memory cell sub-arrays MCA1, illustrating the block selection gates GR1 and GL1 of the preceding figure. The gate GR1 comprises MOS FETs Q1 and Q2, while the gate GL1 comprises MOS FETs Q3 and Q4. The MOS FETs Q2 and Q4 are used for bootstrapping the gate voltage of the MOS FETs Q3 and Q1 respectively. The power source voltage Vcc is applied to gate electrodes of the MOS FETs Q2 and Q4. Shifting the block selection line R1 to H, namely to Vcc, the capacitance of the gate node of the MOS FET Q1 is charged. Subsequently, the common word line CWLRi is enabled, shifting the voltage of the gate electrode of the MOS FET Q1 above Vcc and making the MO FET Q1 definitely conductive. Thus the potential Vcc is provided to the word line WL1i, and the word line WL1i is selected. The function of the MOS FET Q3 for the common word decoder CWDL is the same as MOS FET Q1.

Thus, in the DRAM device of the this embodiment, an access operation is performed by the common word decoder CWDR, for instance, and a refresh operation can be performed by another common word decoder CWDL at the same time. Therefore, both operations are performed independently of each other.

From another point of view, the word lines of the memory cell sub-arrays of the DRAM device shown in FIG. 10 and FIG. 11, each word line of each sub-array can be selectively controlled by one of two common word decoders. This is a feature of the block selection bus line of this embodiment.

However, with this embodiment, each word line of the sub-arrays needs two common word lines for the common word decoders CWDL and CWDR. These common word lines are usually made of aluminum and disposed in the same layer. Therefore, in a RAM device with high packing density, this results in an arrangement of the word lines which too crowded on the surface of the substrate and generates some difficulty in fabrication.

Figure 12:
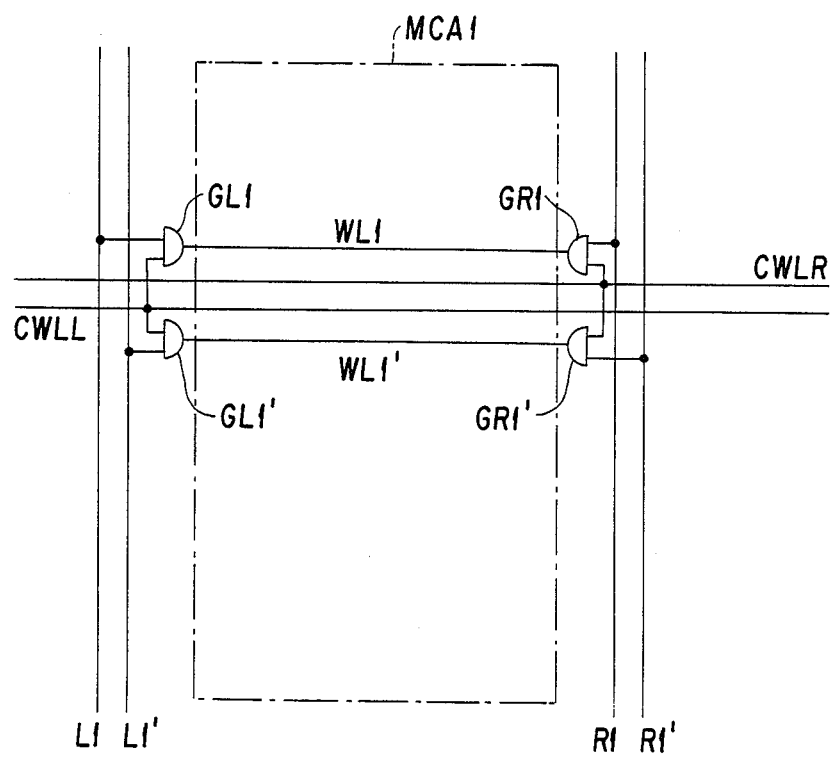
FIG. 12 is a schematic wiring diagram of a word bus line having an improved block selection bus line.

FIG. 12 is a schematic wiring diagram of another alternative embodiment of a word line configuration, illustrating its improved block selection bus line, enabling the reduction of the common word lines CWLR and CWLL by a half, or by a quarter, and the like. Common word lines CWLR and CWLL can select one of two word lines WL1 and WL1', for instance, in conjunction with double block selection lines R1, R1+, and L1, L1' through a pair of AND gates GR1, GR1' and GL1, GL1'. In this manner, a common word line can select one of two word lines of a memory cell sub-array. As the result, in total, the number of the common word lines is reduced by half, thus reducing the density of the common word lines. Furthermore, if the block selection lines are doubled such as R1, R1', R1", and R1"': L1, L1', L1", and L1"', the common word decoder CWDR or CWDL can control four word lines of the sub-array.

Of course, the common word decoders CWDL and CWDR can be arranged on one side area of the sub-arrays and the block selection gates are not limited to be arranged between the sub-arrays as shown in FIG. 10, FIG. 11, and FIG. 12. Various arrangement configuration can be considered.

Figure 13:
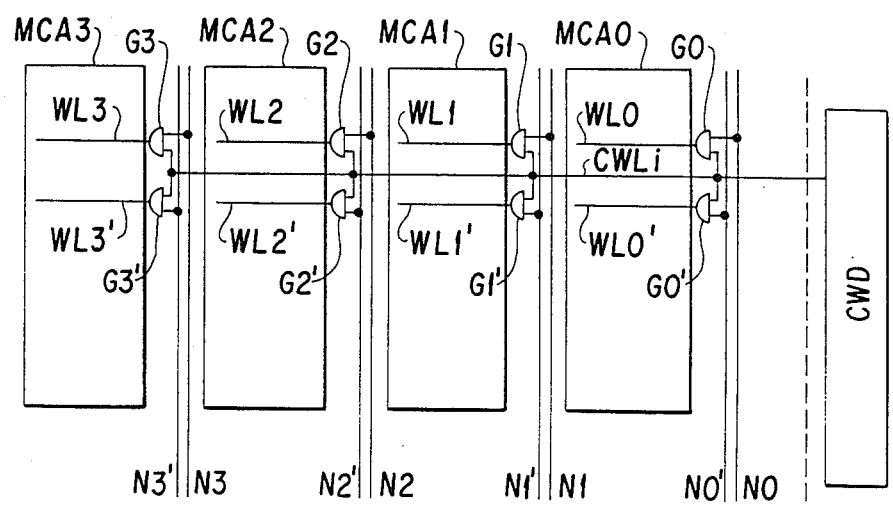
FIG. 13 is a block diagram of a word bus line of for use with RAM devices.

A more generalized bus line of FIG. 12 is illustrated as still another embodiment in a block diagram of FIG. 13. The bus line of this type is applicable to a memory device formed on a semiconductor substrate having an array of a large number of memory cells arranged in a matrix which are further divided into sub-arrays. The application of the bus line of this type is not limited to a DRAM device but is also applicable to a static RAM, for instance.

This block selection bus line aims at the reduction of the common word lines CWLi by a half, or by a quarter, and the like, and the configuration and function principle of the bus line is the same as that of the embodiment of FIG. 12, except that only one word decoder CWD is disposed rather than the two decoders of the fifth embodiment. With regard to the sub-array MCA0, for example, the configuration of the bus line is described. Common word line CWLi can select one of two associated word lines WL0 and WL0' of the sub-array MCA0, in conjunction with double block selection lines N0 and N0' through a pair of AND gates G0 and G0'. Thus, the total number of the common word lines CWL is reduced by half, serving to reduce the high density of the common word lines. Furthermore, if the block selection lines are doubled such as N0, N0', N0", and N0"', the common word decoder CWD can control four word lines of the sub-array.

Figure 14:
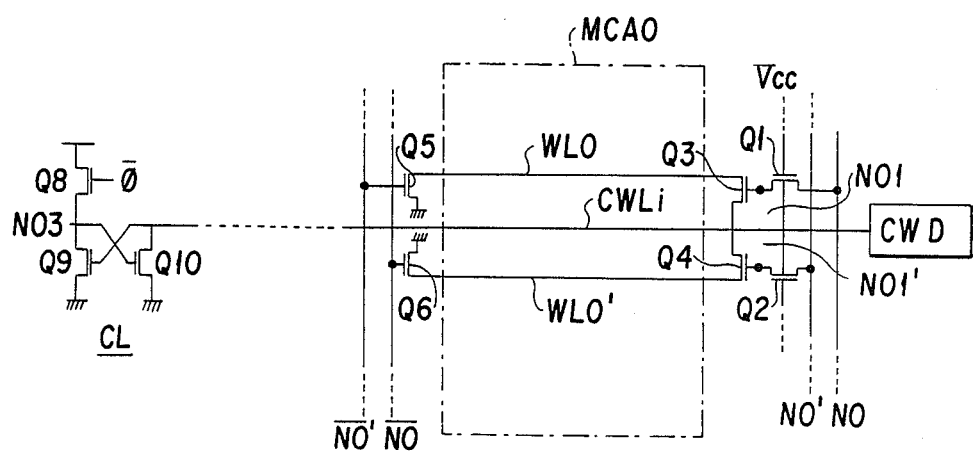
FIG. 14 is a wiring diagram of word bus line of FIG. 13.

FIG. 14 is a wiring diagram of the block selection bus line associated with the sub-array MCA0, for example. The block selection gate G0 comprises two MOS FETs Q1 and Q3 and the gate G0' comprises two MOS FETs Q2 and Q4. The power source voltage Vcc is applied to gate electrodes of the MOS FETs Q1 and Q2. The gate electrodes of MOS FETs Q5 and Q6 are connected to inverted selection lines $\overline{N0}$ and $\overline{N0'}$ applying inverted potential to the selection lines $\overline{N0}$ and $\overline{N0'}$. Thus the MOS FETs Q5 and Q6 are used for clamping the non-selected word lines WL0' to the ground.

Figure 15:
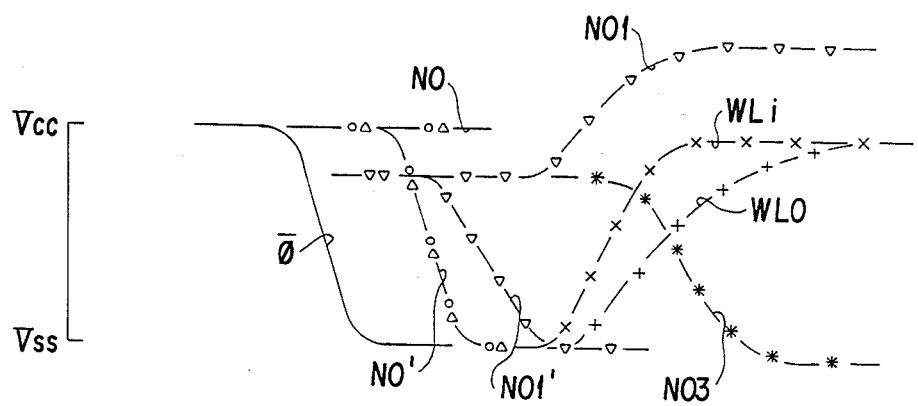
FIG. 15 is a time chart illustrating the potential variation at relevant points of the circuit of FIG. 14 under operation.

The function of the bus line is described referring to a waveform time chart of FIG. 15. A clamping circuit CL is attached as shown on the left side of the figure. Before the word selection operation, the clock signal $\psi$ is in a H state (logic 1), making MOS FET Q8 ON. When the common word line CWLi is in a H state, the ground clamping of the line CWLi is released, and when the line CWLi is in a L state (logic 0), the line CWLi is clamped to Vss.

Then the clock signal $\psi$ descends sharply turning the MOS FET Q8 OFF, thus releasing the ground clamp of the common word line CWLi by the clamping circuit CL. Before the word line selection operation, the selection lines N0 and N0' are in a H state, putting the gate nodes N01 and N01' of respective MOS FETs Q3 and Q4 in a H state. The selection of the line N0 is achieved by lowering the line N0 to a L state. As the line N0' is lowered, the potential on the gate node N01' of the MOS FET Q4 is also lowered. Subsequently, the potential on the common word line CWLi is raised by the common word decoder CWD, the potential of the node N01 is pushed up higher than Vcc by a bootstrap effect, which raises the potential of the word line WL0 up to Vcc. Thus the word line WL0 is selected. The voltage of the node N03 of the clamp circuit CL is also shown in FIG. 15, falling when the line CWLi is in a H state. With other sub-arrays, the circuit functions in the same manner.

By increasing the number N of selection lines (N is taken as 4, 8, etc.), the number of word lines controlled by one common word line can be increased to N lines, further simplifying the structure of the word decoder.

The present invention may be embodied in other forms without departing from the spirit thereof. The presently disclosed embodiments are, therefore, to be considered as illustrative and not restrictive. The scope of the invention is indicated in the appended claims rather than the foregoing description. All modifications which come within the meaning and the equivalency of the claims are therefore, to be embraced therein.

What is claimed is:

1. A dynamic random access memory device (DRAM) formed on a semiconductor substrate haing an array of dynamic memory cells arranged in a matrix, said array being divided into a plurality of sub-arrays of said memory cells, said random access memory device comprising:

a plurality of memory blocks each including one of said sub-arrays;

an access peripheral circuit connected to said memory blocks, said access peripheral circuit outputting access address signals for an access operation, the access address signals being used partially for selecting one of said memory blocks, and partially for accessing one of said memory cells of said sub-array contained in said selected memory block;

a refresh peripheral circuit connected to said memory blocks, said refresh peripheral circuit outputting refresh address signals for a refresh operation, the refresh operation being sequential and cyclical according to a predetermined refresh timing schedule, the refresh address signals being used partially for selecting one of said memory blocks independently of said access address signals output from said access peripheral circuit and partially for refreshing said memory cells of said selected memory blocks; and a block selection peripheral circuit coupled to said access peripheral circuit and said refresh peripheral circuit, said block selection peripheral circuit detecting a double selection, said double selection being the simultaneous selection of the same memory block for the access operation and the refresh operation, and said block selection peripheral circuit selectively implementing the access operation and the refresh operation, wherein when a double selection is not detected by said block selection peripheral circuit, the refresh operation and the access operation are performed in parallel, and when a double selection is detected by said block selection peripheral circuit, the preferential implementation of the refresh operation or access operation is performed under the control of said block selection peripheral circuit according to a predetermined schedule of priority of said operations.

2. A dynamic random access memory device (DRAM) of claim 1, wherein said block selection peripheral circuit comprises:

a first decoder means for outputting refresh block selection signals by decoding the refresh signals applied thereto;

a second decoder means for outputting access block selection signals by decoding the access signals applied thereto;

a comparison circuit means for detecting the double selection of the same memory block by comparing the access block selection signals with the refresh block selection signals and outputting a double selection signal when the double selection is detected; and an access signal invalid circuit means for receiving the access block selection signals and the double selection signal, and selectively invalidating the access block selection signals, such that the access block selection signals are outputted when no double selection is detected, and are invalidated when a double selection is detected, whereby the refresh operation is preferentially performed over the access operation.

3. A dynamic random access memory device (DRAM) of claim 2, wherein the double selection signal from said comparison circuit means is output as a busy signal to the associated outer circuit to temporarily stop the operation thereof.

4. A dynamic random access memory device (DRAM) of claim 1, wherein said block selection peripheral circuit comprises:

a first decoder means for outputting refresh block selection signals by decoding the refresh signals applied thereto;

a second decoder means for outputting access block selection signals by decoding the access signals applied thereto;

a comparison circuit means for detecting the double selection of the same memory block by comparing the access block selection signals with the refresh block selection signals, and for outputting a double selection signal when the double selection is detected;

a refresh signal invalid circuit means for receiving the refresh block selection signals and the double selection signal and selectively invalidating the access block selection signals;

an access signal invalid circuit means for receiving the access block selection signals and the double selection signal and selectively invalidating the refresh block selection signals; and a priority providing means having a predetermined priority schedule stored therein, wherein when the double selection signal is sent from said comparison circuit means to said priority providing means, one of the refresh operation and the access operation is preferentially implemented by invalidating one of a group of the access block selection signals and a group of the refresh block selection signals according to the predetermined priority schedule, and the block selection signals of the remaining group signals are preferentially allowed to be outputted.

5. A dynamic random access memory device (DRAM) of claim 4, wherein said priority providing means comprises:

a memory means for storing data related to the precedence of the refresh operation or access operation; and a refresh/access selection means having a memory means for storing a predetermined block selection schedule of the refresh operation and the access operation to be performed, wherein the refresh block selection signals and the access block selection signals are selectively outputted according to the data stored in said memory means and the stored predetermined block selection schedule.

6. A dynamic random access memory device (DRAM) of claim 4, wherein the double selection signal from said priority providing circuit means is output as a busy signal to the associated outer circuit to temporarily stop the operation thereof.

7. A dynamic random access memory device (DRAM) of claim 1, wherein said memory block comprises said sub-array of memory cells arranged in a matrix having a plurality of word lines and a plurality of bit lines, a plurality of sense amplifiers each being connected to each of said bit lines for amplifying output signals from said bit lines, word decoders and column decoders, wherein said word decoders and said column decoders respectively select said word lines and said bit lines.

8. A dynamic random access memory device (DRAM) of claim 1, wherein each of said plurality of memory blocks includes one of said sub-arrays having a plurality of memory cells in a matrix, a plurality of word lines and a plurality of bit lines, a plurality of sense amplifiers each connected to each of said bit lines and a column decoder for said bit lines of said sub-array and wherein said device further comprises a pair of common word decoders, including a first word decoder and a second word decoder and a plurality of word bus lines, each of said word bus lines comprising:

a pair of common word lines disposed along each row of said memory cells of the said array, said common word lines including a first common word line connected to said first word decoder and a second common word line connected to said second common word decoder;

a pair of block selection lines including a first block selection line and a second block selection line corresponding to each column of said array; and a pair of switching means including a first switching means and a second switching means, wherein each of said word lines located on said row of said array is selectively connected to said first common word line by activating each of the corresponding first switching means through said first common word line and said first block selection line, and to said second common word line by activating each of said corresponding second switching means through said second common word line and said second block selection line, whereby said word lines of said sub-array are selectively controllable by said two common word decoders.

9. A dynamic random access memory device (DRAM) of claim 8, wherein said switching means is a field effect transistor (MOS FET).

10. A dynamic random access memory device (DRAM) of claim 8, wherein said two common word decoders are disposed on peripheral area located at the sides of said array of memory cells and said common word lines are disposed in parallel with said row of said memory cells on said semiconductor substrate.

11. A dynamic random access memory device (DRAM) of claim 8, wherein said common word bus line comprises:

N pairs of a first block selection line and a second block selection line corresponding to each column of said array, wherein N is an integer; and N pairs of a first switching means and a second switching means, wherein each of said word lines located on said row of said array is selectively connected to said first common word line by activating each of the corresponding said first switching means through said first common word line and said first block selection line, and to said second common word line by activating each of the corresponding said second switching means through said second common word line and said second block selection line, whereby N+1 of said word lines of each of said sub-arrays are selectively controllable by said two common word decoders, thus enabling the number of said common lines to be reduced to 1/(N+1).

12. A dynamic random access memory device (DRAM) according to claim 1, wherein when said block selection peripheral circuit detects a double selection of a memory block, the subsequent sequential refresh address signals start to be output from said refresh peripheral circuit at the conclusion of the sequence of the preceding refresh address signals.

13. A random access memory device (RAM) formed on a semiconductor substrate comprising:

an array of memory cells arranged in a matrix, said array being divided into a plurality of sub-arrays of said memory cells, each of said sub-arrays having a plurality of memory cells in a matrix, a plurality of word lines and a plurality of bit lines, and a column decoder for selecting said bit lines a common word decoder; and a plurality of common word bus lines for selecting said word lines located on a row of memory cells of said sub-array, wherein each of said common bus lines comprises:

N pairs of block selection lines corresponding to each column of said array, wherein N is an integer; and N pairs of switching means, wherein each of said word lines located on said array is selectively connected to said common word line by activating each of the corresponding said switching means through said common word line and said block selection line, wherein N of said word lines of each of said sub-arrays are selectively controllable by said common word decoder, thus enabling the number of said common word lines to be reduced to 1/N.

* * * * *